United States Patent [19]

Maeda

[11] Patent Number: 4,880,486
[45] Date of Patent: Nov. 14, 1989

[54] METHOD FOR MOUNTING ELECTRONIC PARTS

[75] Inventor: Yukio Maeda, Hirakata, Japan

[73] Assignee: Matsushita Electric Industrial Co., Ltd., Kadoma, Japan

[21] Appl. No.: 95,182

[22] Filed: Sep. 11, 1987

[30] Foreign Application Priority Data

Sep. 12, 1986 [JP] Japan ................................ 61-216607
Sep. 12, 1986 [JP] Japan ................................ 61-216608

[51] Int. Cl.4 ........................ B32B 31/26; B32B 31/28
[52] U.S. Cl. .............................. 156/273.5; 156/275.5;
156/273.5, 275.5, 275.7, 297, 569, 307.1, 320,
[58] Field of Search ................... 156/242, 272.2, 273.3,
156/273.5, 275.5, 275.7, 297, 569, , 307.1, 320,
562; 264/22; 428/345, 463, 462, 518

[56] References Cited

U.S. PATENT DOCUMENTS 4,127,432 11/1978 Kuwano ............................. 156/562
4,243,500 1/1981 Glennon ........................... 156/331.6
4,311,759 1/1982 Glennon ............................. 156/327
4,372,802 2/1983 Harigane ............................ 156/566
4,720,317 1/1988 Kuroda ............................... 156/250

Primary Examiner—Merrell C. Cashion, Jr.
Attorney, Agent, or Firm—Cushman, Darby & Cushman

[57] ABSTRACT

An adhesive containing at least two main components, and which is capable of being gelled to make it pressure-sensitive, of being photopolymerized and of being thermally polymerized, is applied at selected positions on a printed circuit substrate on which electronic parts are to be loaded. Ultraviolet rays are irradiated on the adhesive, to gelate the adhesive thereby to realize the pressure-sensitive adhesion ability by reaction of a photopolymerization functional group of the adhesive. After loading the electronic parts on the adhesive, the adhesive is hardened by reaction of a thermal polymerization functional group by heating. Thereafter, electrodes of the electronic parts and conductive lands of the printed circuit substrate are soldered.

18 Claims, 4 Drawing Sheets

METHOD FOR MOUNTING ELECTRONIC PARTS

FIELD OF THE INVENTION AND RELATED ART STATEMENT

1. Field of the Invention

The present invention relates to method for mounting electronic parts on a printed circuit substrate, and especially relates to mounting of chip resistor, chip capacitor, mini-molded transistor, flat package IC and like small electronic parts on a printed circuit substrate of a television set, a video tape recorder, an electronic calculator, or the like.

2. Description of the Related Art

Generally, in order to fix electronic parts such as a chip resistor, a chip capacitor, a mini-molded transistor and the like on a printed circuit substrate, a conventional method for fixing the electronic parts having steps of applying a photohardening type adhesive on a surface of the printed circuit substrate, loading the electronic parts on the printed circuit substrate and hardening the adhesive by irradiation by ultraviolet rays or by a combination of irradiation by ultraviolet rays, and heating. Such a method is described in published unexamined Japanese patent applications Sho 54-28668, Sho 54-104573, and Sho 54-98969.

The conventional method intends to shorten the hardening time and to improve the reliabilities of the substrate and the electronic parts. The conventional method has, however, such demerits that positioning errors of the electronic parts are liable to be made by vibration of the printed circuit substrate and the loading head of the loading machine during the loading of the electronic parts since, loading speed of the electronic parts by using automatic loading machine is very fast (as fast as 0.6 to 0.3 second per electronic part) when the electronic parts are loaded on a position where the adhesive has been applied. Furthermore, the positioning errors of the electronic parts occur during conveyance to the ultraviolet ray irradiation chamber after loading the electronic parts on the printed circuit substrate. If the positioning errors of the electronic parts occur, solder can not be applied to exact designed position or shortcircuits between the neighboring electrodes occur.

To solve the above-mentioned problems, the inventor of the present invention already has proposed a method for eliminating the movement of the electronic parts by applying a photopolymerization-type adhesive on a printed circuit substrate and preliminary irradiating the adhesive on the printed circuit substrate using ultraviolet rays for increasing viscosity of the adhesive. Such art is described in published unexamined Japanese patent application Sho 58-180090. Besides, the inventor has previously proposed another method in which the viscosity-increasing of the adhesive is accomplished by heating, which is described in published unexamined Japanese patent application Sho 58-180091.

Such proposed methods, however, have the following problems. Namely, one is that in the methods disclosed in Sho 58-180090 and Sho 58-180091, the photopolymerization functional group is in also subject to thermal polymerization. Therefore, the reaction control was too delicate to obtain the appropriate viscosity of the adhesive by irradiating the ultraviolet rays or heating. Thus, the adhesion ability is liable to be reduced due to over-advance of the reaction in the viscosity-increasing treatment, or insufficiency or unevenness of the viscosity may occur.

On the other hand, there is another method of mounting electronic parts which uses solder paste instead of any adhesive. The method is that the solder paste is applied on selected positions of a printed circuit substrate by silk screen printing. Then a chip resistor, a chip capacitor, a flat package IC and the like are loaded thereon and soldering is made thereto by melting the solder paste by heating the printed circuit substrate. The method using the solder paste has, however, a problem of undesirable standing-up or moving of the electronic parts affected by surface tension of the solder when all the solder paste on the printed circuit substrate is unevenly melted in time, or a problem of inaccurate soldering due to undesirable floating-up of the electrodes of the electronic parts from the surface of the printed circuit substrate when wetting of the solder on the electrodes of the electronic parts is not good.

SUMMARY OF THE INVENTION

One object of the present invention is to provide an improved method for mounting electronic parts in which uneven adhesion force of the adhesive due to uneven viscosity-increasing thereof is prevented. Another object is to provide an improved method for mounting electronic parts in which undesirable standing-up or moving of the electronic parts due to uneven melting of the solder paste is prevented.

The method for mounting electronic parts in accordance with the present invention has steps of:
applying an adhesive on selected positions of a printed circuit substrate where electronic parts are to be mounted, the adhesive containing at least two main components and being subject to photopolymerization, thermal polymerization and pressure-sensitive adhesion by gelation,
irradiating ultraviolet rays on the adhesive, to cause gelation,
loading the electronic parts on the selected positions of the printed circuit substrate, and
soldering electrodes of the electronic parts on conductive lands of the printed circuit substrate.

Another method of for mounting electronic parts in accordance with the present invention includes the steps of:
applying an adhesive on selected positions of a printed circuit substrate where electronic parts are to be loaded, the adhesive containing at least two main components and being capable of photopolymerization, thermal polymerization and pressure-sensitive adhesion by gelation,
applying a solder paste on conductive lands of the printed circuit substrate,
irradiating ultraviolet rays on the adhesive to cause gelation,
loading the electronic parts on the selected positions of the printed circuit substrate,
heating the solder paste for soldering electrodes of the electronic parts on the conductive lands of the printed circuit substrate and for causing thermal polymerization of the adhesive at the same time.

As mentioned above, the present invention uses a liquid adhesive having photopolymerization ability and thermal polymerization ability, and the adhesive can be applied (spreaded) by a dispenser. Furthermore, the adhesive also has ability of pressure-sensitive adhesion by gelation so that the fluidity of the adhesive is destroyed and the pressure-sensitive adhesion ability is given by the gelation by irradiating ultraviolet rays on the adhesive. Therefore, by only loading the electronic parts on the printed circuit substrate and pressing them on the adhesive, the electronic parts are fixed thereto. And there is no fear of positioning error or moving of the electronic parts.

Since the photopolymerization functional group of the adhesive used is of a different kind from that of the thermal polymerization, the desired polymerization can be practiced. Therefore, a very stable pressure-sensitive adhesion ability can be obtained and a suitable bond strength for fixing the parts on the printed circuit substrate can be obtained by thermohardening.

DESCRIPTION OF THE PREFERRED EMBODIMENTS

One of the most preferred embodiments of a method for mounting electronic parts in accordance with the present invention is described as follows, with reference to FIG. 1, FIG. 2(a), FIG. 2(b), FIG. 2(c) and FIG. 2(d).

An adhesive having capabilities of being photopolymerized and thermally polymerized, is made up by mixing and melting of alkylacrylate or trimethylolpropanetriacrylate, containing an acryloyl group as its photopolymerization functional group, 1-hydroxy cyclohexyl-phenylketone, which is an intensifying agent for ultraviolet rays, bisphenol A-type epoxy resin containing glycidyl group as a thermal polymerization functional group, tertiary amine as a curing agent for the epoxy resin and rosin as a viscosity-increasing subagent.

Figure 1:
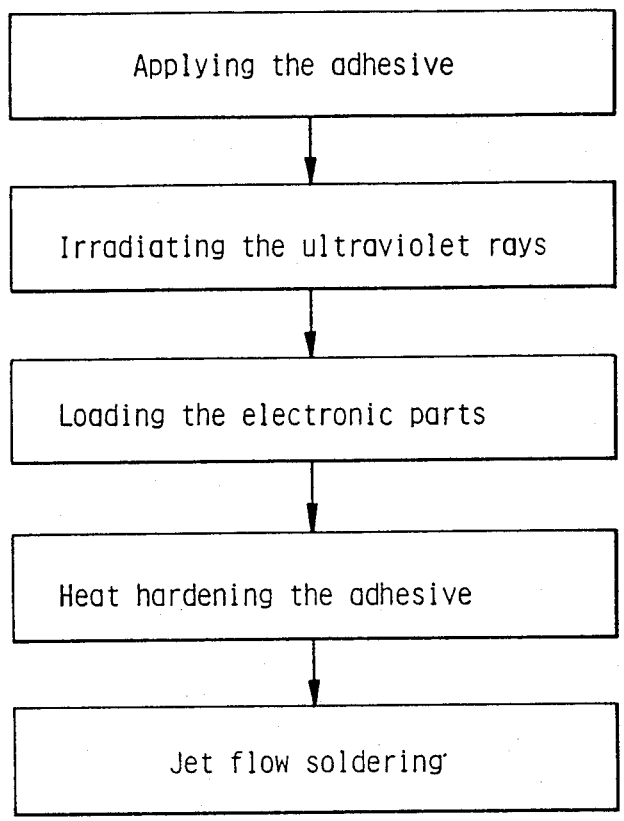
FIG. 1 is a flow chart showing the steps of a preferred embodiment of a method for mounting electronic parts in accordance with the present invention.
Figure 2A:
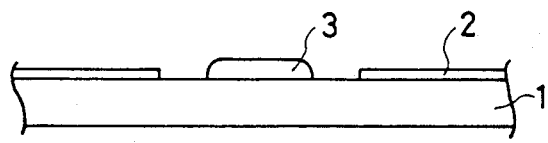
FIG. 2(a), FIG. 2(b), FIG. 2(c) and FIG. 2(d) are side views showing the steps of the method for mounting electronic parts shown in FIG. 1.
Figure 2B:
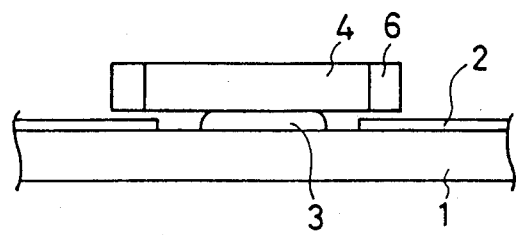
Figure 2C:
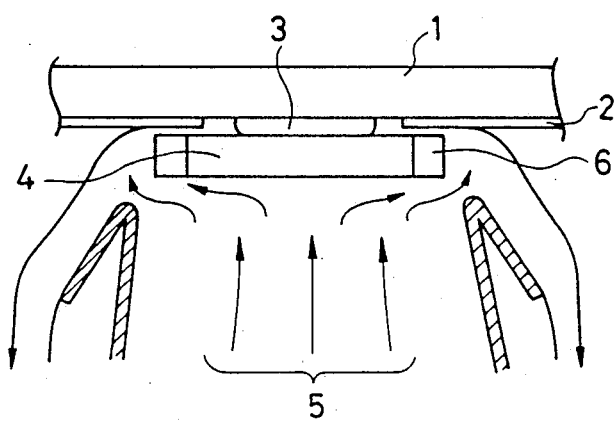
Figure 2D:
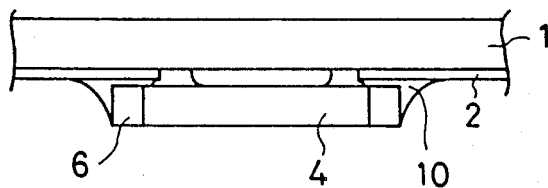
Figure 3:
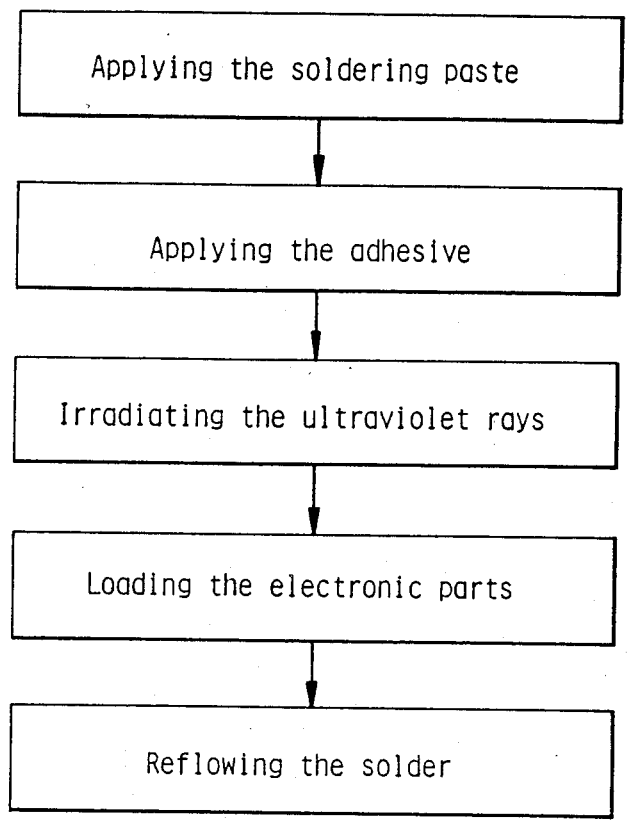
FIG. 3 is a flow chart showing steps of another preferred embodiment of a method for mounting electronic parts in accordance with the present invention.

Electronic parts are mounted by following the steps shown in FIG. 1 with the above-mentioned adhesive. Namely, the adhesive 3 is applied at positions on a printed circuit substrate 1 on which the electronic parts are to be loaded by using a press-discharge type dispenser. Thereafer, ultraviolet rays are irradiated for ten seconds by means of a high-pressure mercury lamp for gelating the adhesive 3 so as to destroy the fluidity of the adhesive and to give pressure-sensitive adhesion ability to the adhesive. The printed circuit substrate 1 bearing such a pressure-sensitive adhesive is set on an automatic parts-loading machine, and the chip-type electronic parts 4 are loaded one-by-one on selected positions where the adhesive 3 is already gelated, and adequately pressed by a mounting head for adhering the electronic parts on the substrate as shown in FIG. 2(b). In this state, when the printed circuit substrate 1 is vibrated or moved at high speed in a level plane, position errors of the chip-type electronic parts 4 may not occur. Continuously thereafter, the printed circuit substrate is heated for three minutes at 150° C. for hardening the adhesive 3, and thereby the pressure-sensitive adhesion ability is destroyed. After that, the printed circuit substrate 1 is put upside-down in a jet flow solder tub as shown in FIG. 2(c) for spraying solder flow 5, and the soldering land 2 of the printed circuit substrate 1 and the electrode 6 of the electronic parts 4 are soldered by the solder 10 which is the congealed solder flow 5 as shown in FIG. 2(d).

The heating process for hardening the adhesive can be replaced with preliminary heating of the printed circuit substrate on which flux is applied before jet flow soldering or with heating of the solder flow.

Another preferred embodiment of a method for mounting electronic parts in accordance with the present invention is described as follows, with reference to FIG. 3, FIG. 4(a), FIG. 4(b), FIG. 4(c) and FIG. 4(d).

Figure 4A:
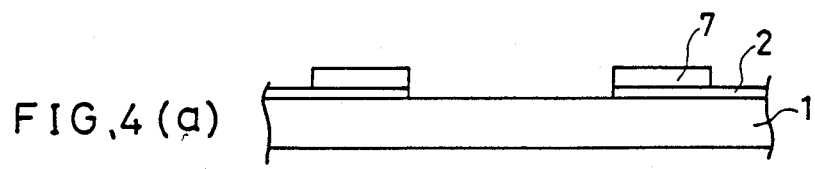
FIG. 4(a), FIG. 4(b), FIG. 4(c) and FIG. 4(d) are side views showing the steps of the method for mounting electronic parts shown in FIG. 3.
Figure 4B:
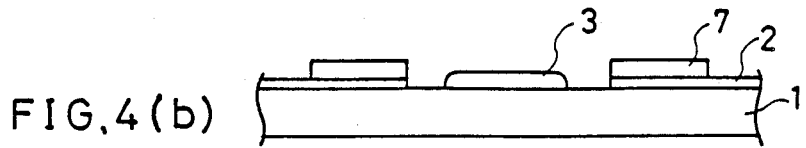
Figure 4C:
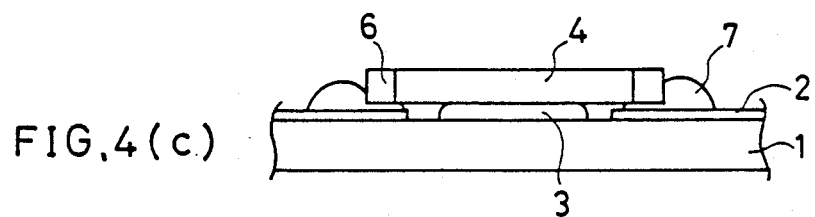
Figure 4D:
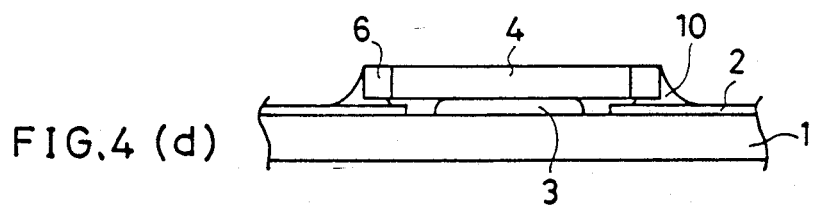

At first, an adhesive which is subject to photopolymerization and thermal polymerization is made up in the same way as in the above-described embodiment. Then, the solder paste 7 is applied on the soldering land 2 (which is a conductor part on which the soldering is made) of the printed circuit substrate 1 by a using screen printing method, as shown in FIG. 4(a). Hereupon, the solder paste is a mixure of granular solder and dissolved rosin in an organic solvent. Next, the adhesive 3 is applied to selected positions on a printed circuit substrate 1 on which the electronic parts are to be loaded by using a press-discharge type dispenser as shown in FIG. 4(b). Thereafter, ultraviolet rays are irradiated for ten seconds on the adhesive 3 for gelating the adhesive so as to destroy the fluidity thereof and to give pressure-sensitive adhesion ability thereto by using a high-pressure mercury lamp in which the infrared rays are reduced by a cold mirror (heat-absorbing filter) so as not to be over 60° C. higher than the temperature of the printed circuit substrate. Such a circuit substrate 1 is set on an automatic parts-loading machine, and the chip-type electronic parts 4 are serially loaded on the gelated adhesive 3 and adequately pressed by a mounted head for adhering the parts on the substrate as shown in FIG. 4(b). In this case, not only positioning errors of the electronic parts 4 due to the vibration or movement at high speed of the printed circuit substrate 1, but also the standing-up or floating of the electronic parts 4 due to the time unevenness of melting of the solder at the soldering lends 2 of the printed circuut substrate 1 during the reflow of the soldering paste 7 caused by heating thereafter. In solder reflow process, the soldering paste 7 is melted by heating the printed circuit substrate 1 by heat radiation of a panel heater, or hot blast. And the soldering lands 2 of the printed circuit substrate 1 and the electrode 6 of the chip-type electronic parts 4 are soldered by solder 10 as shown in FIG. 4(d).

Hereupon, the adhesive 3 is hardened by heating in the solder reflow process at the same time. As a result, the heat-resisting ability of the adhesive is improved and the pressure-sensitive adhesion ability is destroyed.

In the above-mentioned embodiments, as method of applying the adhesive, the applying of a press-discharge-type adhesive dispenser or a screen printing-using stencil can be applied. In applying the adhesive by a adhesive dispenser, it is desirable to make the discharging nozzle have a dispensing opening of rectangular or elliptic slit shape, to apply the adhesive 3 on the printed circuit substrate 1 in a film-like shape. The application of the adhesive 3 is made by putting the dispensing opening of the discharging nozzle close to the printed circuit substrate and moving the nozzle, so as to move it in a direction perpendicular to the major axis of the nozzle opening. Such a method can prevent separation of the terminals of the electronic parts from the soldering land of the printed circuit substrate when the thickness of the adhesive is too large by being applied in a dot-like pattern.

The application of the adhesive by screen printing makes controlling of the thickness of the adhesive easy. But when the application of the adhesive and subsequent application of the soldering paste are made by a common screen printing method, there was a fear that the adhesive would be undesirably removed by touching of the stencil thereto in the application of the paste solder. Therefore, in order to overcome such trouble, it is preferable to provide grooves on positions where the stencil contacts with the adhesive during printing of the soldering paste.

What is claimed is:

1. A method for mounting electronic parts having electrodes, to conductive lands of a printed circuit substrate, at selected positions on said substrate, comprising:
   (a) applying to selected positions of a printed circuit substrate having conductive lands, an adhesive which is constituted by a mixture of at least two components one of which renders the adhesive photopolymerizable and the other of which renders the adhesive thermally polymerizable;
   (b) irradiating said adhesive on said substrate with ultraviolet radiation and thereby causing said adhesive to gelate and to become a pressure-sensitive adhesive;
   (c) loading a plurality of electronic parts having electrodes, onto said pressure-sensitive adhesive at said selected positions, thereby adhering said electronic parts to said substrate at said selected positions, with said electrodes of said electronic parts juxtaposed with said conductive lands of said substrate; and
   (d) soldering respective ones of said electrodes to respective ones of said conductive lands.

2. The method of claim 1, further comprising:
   after conducting step (c) and simultaneously with conducting step (d), thermally polymerizing said adhesive by applying heat thereto and thereby hardening said adhesive and causing said adhesive to become no longer pressure-sensitive.

3. The method of claim 1, wherein:
   at least one of said two components contains an acryloyl group which provides said adhesive, as applied to said substrate, with photopolymerizability.

4. The method of claim 1, wherein:
   at least one of said two components contains a glycidyl group which provides said adhesive, as applied to said substrate, with thermal polymerizability.

5. The method of claim 4, wherein:
   at least one of said two components contains an acryloyl group which provides said adhesive, as applied to said substrate, with photopolymerizability.

6. The method of claim 1, wherein:
   step (d) is conducted by spraying said electrodes and lands, where juxtaposed, with solder after step (c) has been conducted and allowing said solder to congeal.

7. The method of claim 6, wherein:
   after conducting step (c) and simultaneously with conducting step (d), thermally polymerizing said adhesive by applying heat thereto and thereby hardening said adhesive and causing said adhesive to become no longer pressure-sensitive.

8. The method of claim 7, wherein:
   said step of applying heat is conducted by transferring heat from said solder to said adhesive as said solder is being sprayed onto said electrodes and lands.

9. The method of claim 1, wherein:
   step (d) is conducted by applying a solder paste on said conductive lands before conducing step (b), and heating and thereby melting said solder paste into melted solder after conducting step (c), and then permitting the melted solder to congeal.

10. The method of claim 9, wherein:
    after conducting step (c) and no later than simultaneously with conducting step (d), thermally polymerizing said adhesive by applying heat thereto and thereby hardening said adhesive and causing said adhesive to become no longer pressure-sensitive.

11. The method of claim 10, wherein:
    said steps of applying heat to thermally polymerize said adhesive and heating to melt said solder paste are conducted simultaneously.

12. The method of claim 11, wherein:
    at least one of said two components contains an acryloyl group which provides said adhesive, as applied to said substrate, with photopolymerizability.

13. The method of claim 11, wherein:
    at least one of said two components contains a glycidyl group which provides said adhesive, as applied to said substrate, with thermal polymerizability.

14. The method of claim 13, wherein:
    at least one of said two components contains an acryloyl group which provides said adhesive, as applied to said substrate, with photopolymerizability.

15. The method of claim 1, further comprising:
    after conducting step (c), but before conducting step (d), thermally polymerizing said adhesive by applying heat thereto and thereby hardening said adhesive and causing said adhesive to become no longer pressure-sensitive.

16. The method of claim 6, further comprising:
    after conducting step (c), but before conducting step (d), thermally polymerizing said adhesive by applying heat thereto and thereby hardening said adhesive and causing said adhesive to become no longer pressure-sensitive.

17. A method for mounting electronic parts having electrodes, to conductive lands of a printed circuit substrate, at selected positions on said substrate, comprising:
    (a) applying to selected positions of a printed circuit substrate having conductive lands, an adhesive which is constituted by a mixture of at least two components, one of which renders the adhesive photopolymerizable and the other of which renders the adhesive thermally polymerizable;
    (b) applying a solder paste on said conductive lands;
    (c) irradiating said adhesive on said substrate with ultraviolet radiation and thereby causing said adhesive to gelate and to become a pressure-sensitive adhesive;
    (d) loading a plurality of electronic parts having electrodes, onto said pressure-sensitive adhesive at said selected positions, thereby adhering said electronic parts to said substrate at said selected positions, with said electrodes of said electronic parts juxtaposed with said conductive lands of said substrate; and (e) heating and thereby melting said solder paste into melted solder, and then permitting the melted solder to congeal, thereby soldering respective ones of said electrodes to respective ones of said conductive lands.

18. The method of claim 9, wherein:
after conducting step (c), but before conducting step (d), thermally polymerizing said adhesive by applying heat thereto and thereby hardening said adhesive and causing said adhesive to become no longer pressure-sensitive.

* * * * *